(12) United States Patent
Pohlers et al.

(10) Patent No.: US 10,162,266 B2
(45) Date of Patent: *Dec. 25, 2018

(54) PHOTORESIST PATTERN TRIMMING METHODS

(71) Applicant: Rohm and Haas Electronic Materials LLC, Marlborough, MA (US)

(72) Inventors: Gerhard Pohlers, Needham, MA (US); Cheng-Bai Xu, Southborough, MA (US); Kevin Rowell, Brighton, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/145,207

(22) Filed: Dec. 31, 2013

(65) Prior Publication Data

US 2014/0186772 A1    Jul. 3, 2014

Related U.S. Application Data

(60) Provisional application No. 61/748,035, filed on Dec. 31, 2012.

(51) Int. Cl.
*G03F 7/32* (2006.01)
*G03F 7/40* (2006.01)
*G03F 7/039* (2006.01)

(52) U.S. Cl.
CPC ............ *G03F 7/405* (2013.01); *G03F 7/0397* (2013.01)

(58) Field of Classification Search
CPC .......... G03F 7/0392; G03F 7/40; G03F 7/405; H01L 21/0274
USPC .................................................. 430/315, 330
See application file for complete search history.

(56) References Cited

U.S. PATENT DOCUMENTS

| 4,511,683 | A  | * | 4/1985  | Shinohara et al. .............. 524/3 |
| 5,247,116 | A  | * | 9/1993  | Buese .................... C07F 7/0874 556/460 |
| 6,180,320 | B1 |   | 1/2001  | Saito et al. |
| 6,274,289 | B1 |   | 8/2001  | Subramanian et al. |
| 6,372,829 | B1 |   | 4/2002  | Lamanna et al. |
| 6,492,075 | B1 |   | 12/2002 | Templeton et al. |
| 7,338,750 | B2 |   | 3/2008  | Kozawa et al. |
| 7,862,982 | B2 | * | 1/2011  | Burns et al. ............... 430/270.1 |
| 8,067,148 | B2 |   | 11/2011 | Endou et al. |
| 9,448,486 | B2 | * | 9/2016  | Liu .......................... G03F 7/405 |
| 2003/0138736 | A1 | * | 7/2003 | Nitta et al. .................... 430/326 |
| 2004/0142279 | A1 |   | 7/2004  | Bok et al. |
| 2006/0263728 | A1 |   | 11/2006 | Shinbori et al. |
| 2008/0063985 | A1 |   | 3/2008  | Jung et al. |
| 2011/0174774 | A1 |   | 7/2011  | Lin et al. |
| 2012/0219919 | A1 | * | 8/2012 | Thiyagarajan .......... G03F 7/405 430/331 |
| 2013/0171574 | A1 |   | 7/2013  | Xu et al. |
| 2013/0171825 | A1 | * | 7/2013 | Xu ................................. 438/694 |
| 2014/0187027 | A1 |   | 7/2014  | Xu et al. |
| 2015/0214056 | A1 |   | 7/2015  | Xu et al. |

FOREIGN PATENT DOCUMENTS

| CN | 101592858 A | 12/2009 |
| CN | 102376561 A | 3/2012 |
| JP | 2002006512 A | 1/2002 |
| JP | 2002299202 A | 10/2002 |
| JP | 4329216 B2 | 9/2009 |
| JP | 2010049247 A | 3/2010 |

OTHER PUBLICATIONS

Search Report for corresponding Taiwanese Application No. 102148976, dated Feb. 9, 2015.
Search report for corresponding China Application No. 201310757477.X dated Jun. 14, 2018.
Search report for corresponding Chinese Application No. 201310757477.X dated Jun. 17, 2016.

* cited by examiner

*Primary Examiner* — Daborah Chacko-Davis
(74) *Attorney, Agent, or Firm* — Jonathan D. Baskin

(57) ABSTRACT

Provided are methods of trimming a photoresist pattern. The methods comprise: (a) providing a semiconductor substrate; (b) forming a photoresist pattern on the substrate, wherein the photoresist pattern is formed from a chemically amplified photoresist composition comprising: a matrix polymer comprising an acid labile group; a photoacid generator; and a solvent; (c) coating a photoresist trimming composition on the substrate over the photoresist pattern, wherein the trimming composition comprises: a matrix polymer, an aromatic acid that is free of fluorine; and a solvent; (d) heating the coated substrate, thereby causing a change in polarity of the photoresist matrix polymer in a surface region of the photoresist pattern; and (e) contacting the photoresist pattern with a rinsing agent to remove the surface region of the photoresist pattern, thereby forming a trimmed photoresist pattern. The methods find particular applicability in the manufacture of semiconductor devices.

16 Claims, 1 Drawing Sheet

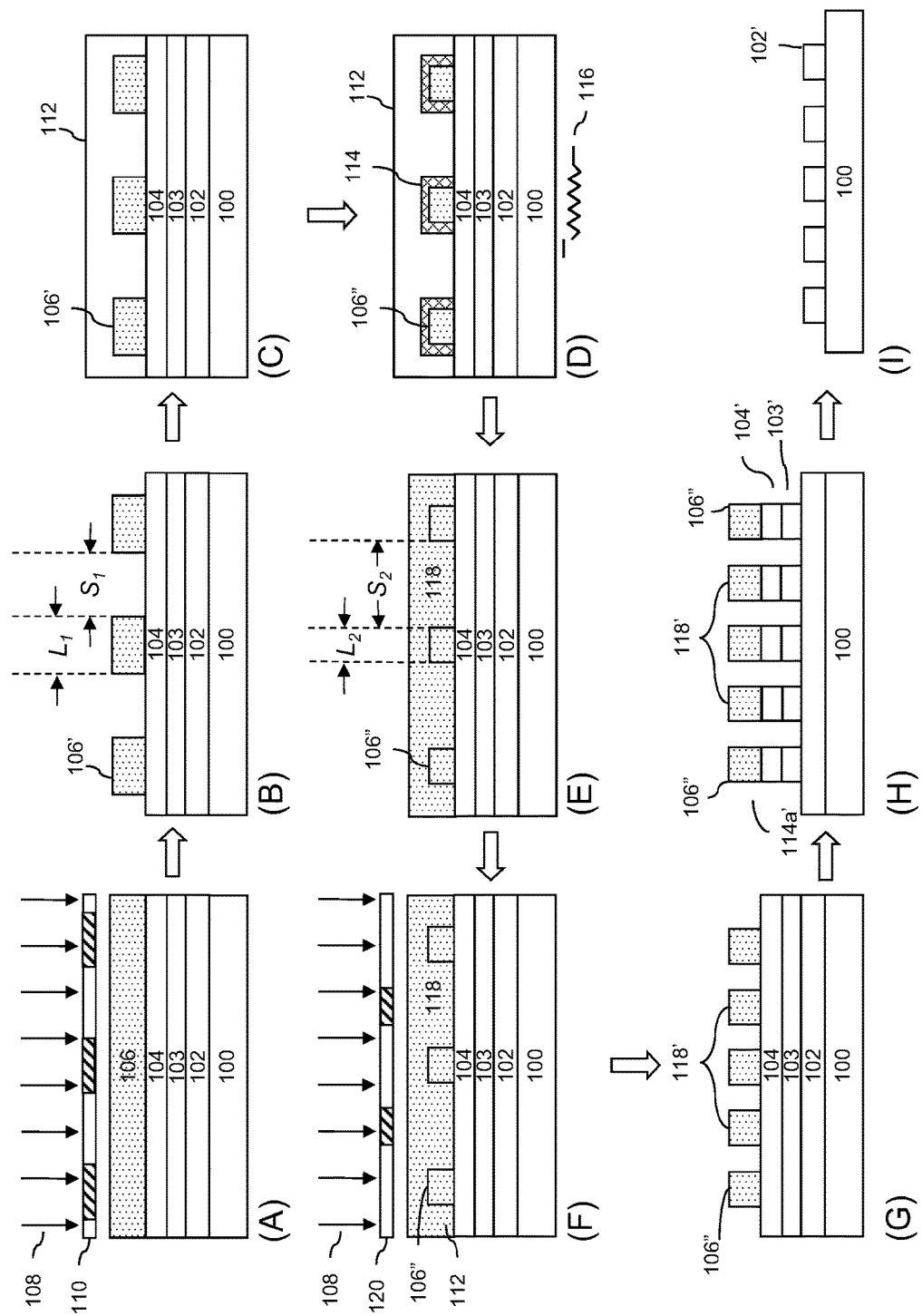

PHOTORESIST PATTERN TRIMMING METHODS

This application claims the benefit of priority under 35 U.S.C. § 119(e) to U.S. Provisional Application No. 61/748,035, filed Dec. 31, 2012, the entire contents of which application are incorporated herein by reference.

BACKGROUND

The invention relates generally to the manufacture of electronic devices. More specifically, this invention relates to methods of trimming photoresist patterns useful in shrink processes for the formation of fine lithographic patterns.

In the semiconductor manufacturing industry, photoresist materials are used for transferring an image to one or more underlying layers, such as metal, semiconductor and dielectric layers, disposed on a semiconductor substrate, as well as to the substrate itself. Photoresist materials further find use in semiconductor manufacture in the formation of ion implantation masks. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a resin having acid-labile leaving groups and a photoacid generator. Exposure to actinic radiation causes the acid generator to form an acid which, during post-exposure baking, causes cleavage of the acid-labile groups in the resin. This creates a difference in solubility characteristics between exposed and unexposed regions of the resist in an aqueous alkaline developer solution. In a positive tone development (PTD) process, exposed regions of the resist are soluble in the aqueous alkaline developer and are removed from the substrate surface, whereas unexposed regions, which are insoluble in the developer, remain after development to form a positive image.

One approach to achieving nm-scale feature sizes in semiconductor devices is the use of short wavelengths of radiation such as 200 nm or less, for example, 193 nm or EUV wavelengths (e.g., 13.5 nm) during exposure of chemically amplified photoresists. To further improve lithographic performance, immersion lithography tools have been developed to effectively increase the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium. When using water as the immersion fluid, the maximum numerical aperture can be increased, for example, from 1.2 to 1.35. With such an increase in numerical aperture, it is possible to achieve a 40 nm half-pitch resolution in a single exposure process, thus allowing for improved design shrink. This standard immersion lithography process, however, is generally not suitable for manufacture of devices requiring greater resolution, for example, for the 32 nm and 22 nm half-pitch nodes.

Considerable effort has been made to extend the practical resolution beyond that achieved with standard photolithographic techniques from both a materials and processing standpoint. For example, multiple (i.e., double or higher order) patterning processes have been proposed for printing CDs and pitches beyond lower resolution limits of conventional lithographic tools. One such double patterning process is litho-litho-etch (LLE) double patterning, which involves formation of a first lithographic photoresist pattern followed by formation of a second lithographic photoresist pattern, wherein lines of the second pattern are disposed between adjacent lines of the first pattern. Such a process is disclosed, for example, in U.S. Patent Application Publication No. US2008/0063985A1. LLE double patterning and other advanced lithographic processes often require the formation of isolated features such as lines or posts by direct lithographic printing. The formation of isolated features with an acceptable process window, however, can pose a challenge as a result of poor aerial image contrast at defocus.

There is a continuing need in the art for improved photolithographic methods for the formation of fine patterns in electronic device fabrication.

SUMMARY OF THE INVENTION

In accordance with a first aspect of the invention, methods of trimming a photoresist pattern are provided. The methods comprise: (a) providing a semiconductor substrate; (b) forming a photoresist pattern on the substrate, wherein the photoresist pattern is formed from a chemically amplified photoresist composition comprising: a matrix polymer comprising an acid labile group; a photoacid generator; and a solvent; (c) coating a photoresist trimming composition on the substrate over the photoresist pattern, wherein the trimming composition comprises: a matrix polymer, an aromatic acid that is free of fluorine; and a solvent; (d) heating the coated substrate, thereby causing a change in polarity of the photoresist matrix polymer in a surface region of the photoresist pattern; and (e) contacting the photoresist pattern with a rinsing agent to remove the surface region of the photoresist pattern, thereby forming a trimmed photoresist pattern.

In accordance with a further aspect of the invention, provided are electronic devices formed by the methods described herein.

Photoresist pattern trimming methods of the invention can produce very fine lithographic patterns and process window for formation of isolated patterns can be improved.

DESCRIPTION OF THE DRAWINGS

The present invention will be described with reference to the following drawing, in which like reference numerals denote like features, and in which:

FIG. 1A-I illustrates a process flow for forming a photolithographic pattern in accordance with the invention.

DETAILED DESCRIPTION

Photoresist Trimming Compositions

The photoresist trimming compositions include a matrix polymer, an aromatic acid that is free of fluorine and a solvent, and can include optional additional components. When coated over a photoresist pattern formed from a chemically amplified photoresist composition, the photoresist trimming compositions can provide various benefits such as controllably reduced resist pattern dimensions and improved process window for the formation of isolated patterns such as isolated lines and posts.

The matrix polymer allows for the compositions to be coated over the photoresist pattern in the form of a layer having a desired thickness. This will help to ensure the presence of a sufficient content of acid for interaction with the photoresist pattern surface.

The matrix polymer should have good solubility in the developer solution to be used in the trimming process. For example, the matrix polymer can be soluble in an aqueous alkaline developer, preferably aqueous quaternary ammonium hydroxide solutions such as aqueous tetramethylammonium hydroxide, or in water. To minimize residue defects originated from the overcoat materials, the dissolution rate of a dried layer of the trimming composition should be greater than that of the photoresist pattern surface region to be removed by the developer solution. The matrix polymer typically exhibits a developer dissolution rate of 100 Å/second or higher, preferably 1000 Å/second or higher. The matrix polymer is soluble in the solvent of the trimming composition, described herein. The matrix polymer can be chosen, for example, from polyvinyl alcohols, polyacrylic acids, polyvinyl pyrrolidones, polyvinyl amines, polyvinyl acetals, poly(meth)acrylates and combinations thereof. Preferably, the polymer contains one or more functional group chosen from —OH, —COOH, —SO$_3$H, SiOH, hydroxyl styrene, hydroxyl naphthalene, sulfonamide, hexafluoroisopropyl alcohol, anhydrates, lactones, esters, ethers, allylamine, pyrolidones and combinations thereof.

The content of the matrix polymer in the composition will depend, for example, on the target thickness of the layer, with a higher polymer content being used for thicker layers. The matrix polymer is typically present in the compositions in an amount of from 80 to 99 wt %, more typically from 90 to 98 wt %, based on total solids of the trimming composition. The weight average molecular weight of the polymer is typically less than 400,000, preferably from 3000 to 50,000, more preferably from 3000 to 25,000.

Polymers useful in the overcoat compositions can be homopolymers or can be copolymers having a plurality of distinct repeat units, for example, two, three or four distinct repeat units. The trimming compositions typically include a single polymer, but can optionally include one or more additional polymer. Suitable polymers and monomers for use in the overcoat compositions are commercially available and/or can readily be made by persons skilled in the art.

The trimming compositions further include one or more aromatic acid that is free of fluorine. Fluorine-free aromatic acids can be more environmentally friendly than fluorinated acids. In the case of a photoresist based on deprotection reaction, the acid with heat can cleave the bond of acid labile groups in the photoresist pattern.

The aromatic acid is preferably a sulfonic acid comprising a phenyl, biphenyl, naphthyl, anthracenyl, thiophene or furan group. The aromatic acid is preferably chosen from one or more aromatic sulfonic acids of the following general formulas (I)-(VI):

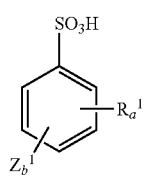
(I)

wherein: $R^1$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^1$ independently represents a group chosen from carboxyl, hydroxy, nitro, cyano, C1 to C5 alkoxy, formyl and sulfonic acid; a and b are independently an integer from 0 to 5; and a+b is 5 or less;

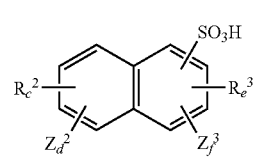
(II)

wherein: $R^2$ and $R^3$ each independently represents a substituted or unsubstituted C1-C20 alkyl group, a substituted or unsubstituted C5-C16 aryl group or a combination thereof, optionally containing one or more group chosen from carbonyl, carbonyloxy, sulfonamido, ether, thioether, a substituted or unsubstituted alkylene group, or a combination thereof; $Z^2$ and $Z^3$ each independently represents a group chosen from carboxyl, hydroxy, nitro, cyano, C1 to C5 alkoxy, formyl and sulfonic acid; c and d are independently an integer from 0 to 4; c+d is 4 or less; e and f are independently an integer from 0 to 3; and e+f is 3 or less;

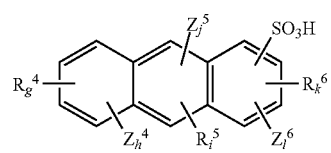
(III)

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 2; i+j is 2 or less; k and l are independently an integer from 0 to 3; and k+l is 3 or less;

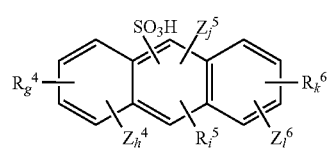
(IV)

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 1; i+j is 1 or less; k and l are independently an integer from 0 to 4; and k+l is 4 or less;

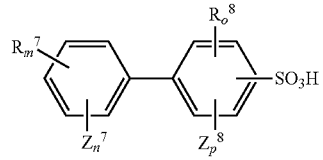

(V)

wherein: $R^7$ and $R^8$ each independently represents a substituted or unsubstituted C1-C20 alkyl group, a substituted or unsubstituted C5-C14 aryl group or a combination thereof, optionally containing one or more group chosen from carboxyl, carbonyl, carbonyloxy, sulfonamido, ether, thioether, a substituted or unsubstituted alkylene group, or a combination thereof; $Z^7$ and $Z^8$ each independently represents a group chosen from hydroxy, nitro, cyano, C1 to C5 alkoxy, formyl and sulfonic acid; m and n are independently an integer from 0 to 5; m+n is 5 or less; o and p are independently an integer from 0 to 4; and o+p is 4 or less; and

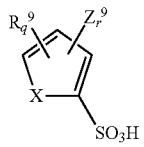

(VI)

wherein: X is O or S; $R^9$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^9$ independently represents a group chosen from carboxyl, hydroxy, nitro, cyano, C1 to C5 alkoxy, formyl and sulfonic acid; q and r are independently an integer from 0 to 3; and q+r is 3 or less. For each of the structures, it should be clear that the $R^1$—$R^9$ groups can optionally form a fused structure together with their respective associated rings. The aromatic acid is typically present in the compositions in an amount of from 0.01 to 20 wt %, more typically from 0.1 to 10 wt % or from 1 to 5 wt %, based on total solids of the trimming composition.

Exemplary aromatic acids for use in the pattern trimming compositions include, without limitation, the following:

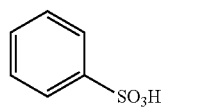 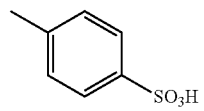

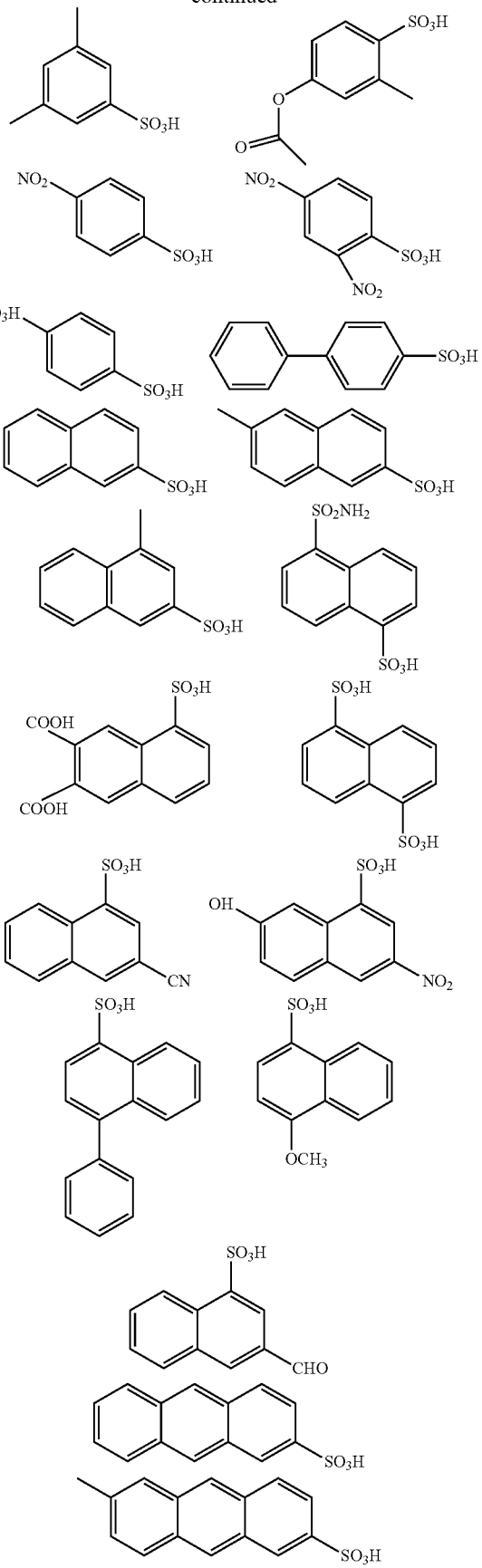

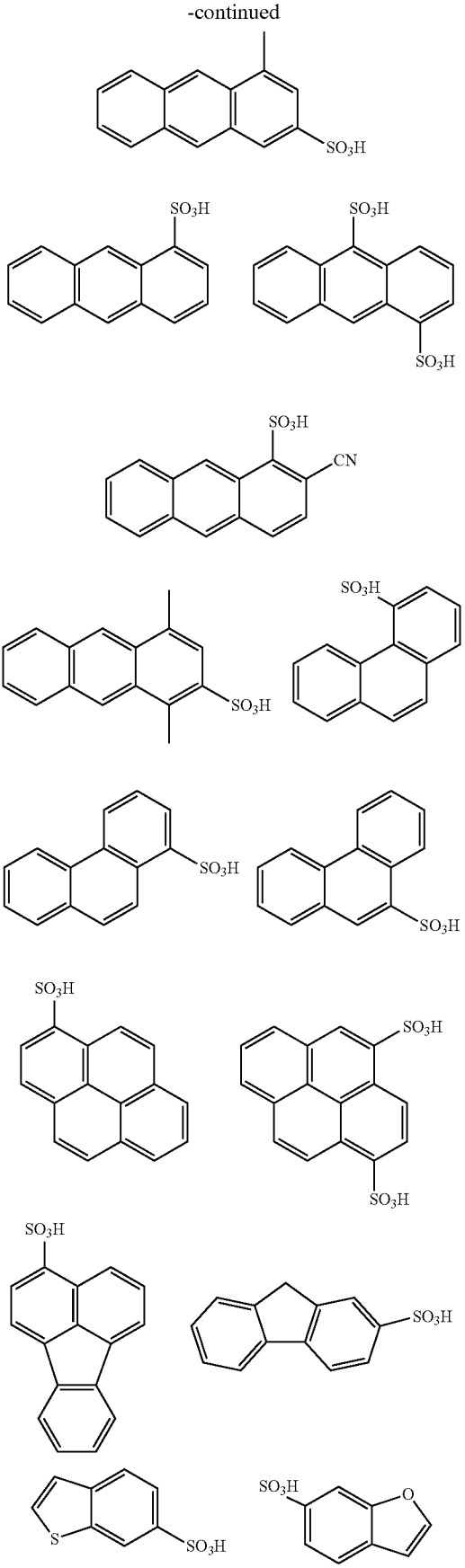
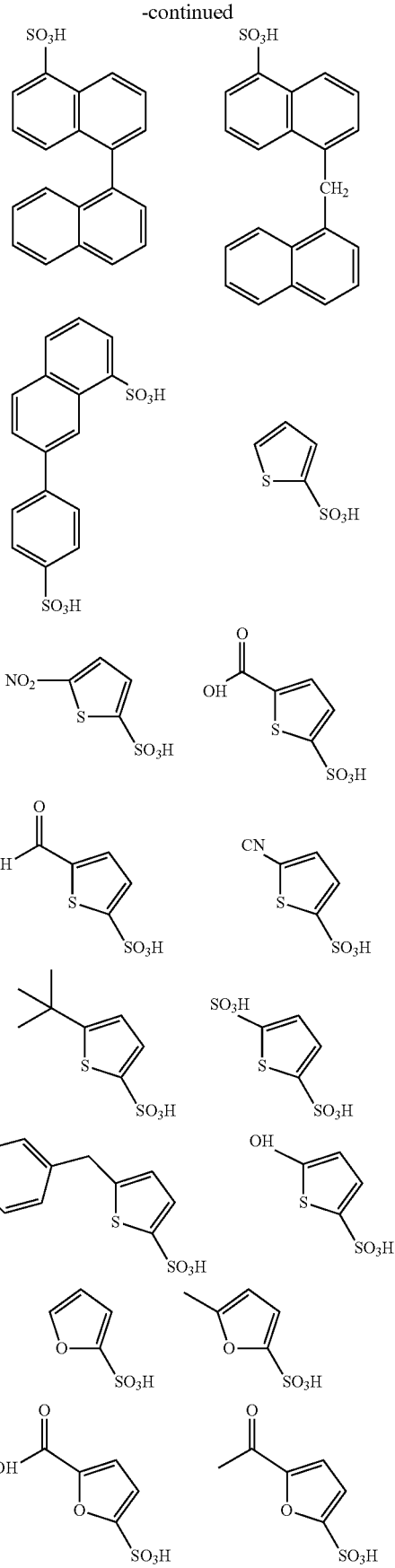

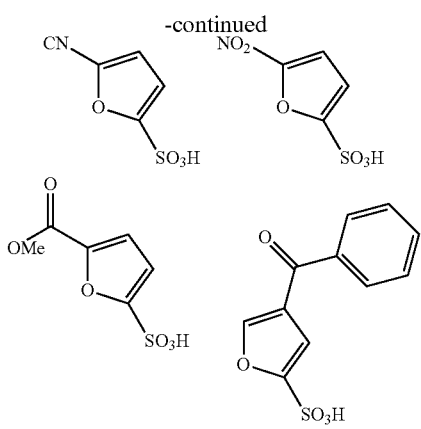

The trimming compositions further include a solvent or solvent mixture. The trimming compositions can take the form of an aqueous solution. Suitable solvent materials to formulate and cast the trimming compositions exhibit very good solubility characteristics with respect to the non-solvent components of the trimming composition, but do not appreciably dissolve the underlying photoresist pattern so as to minimize intermixing. The solvent is typically chosen from water, organic solvents and mixtures thereof. Suitable organic solvents for the trimming composition include, for example: alkyl esters such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; alcohols such as straight, branched or cyclic $C_4$-$C_9$ monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; ethers such as isopentyl ether and dipropylene glycol monomethyl ether; and mixtures containing one or more of these solvents. Of these organic solvents, alcohols, aliphatic hydrocarbons and ethers are preferred. The solvent component of the trimming composition is typically present in an amount of from 90 to 99 wt % based on the trimming composition.

The trimming compositions may include optional additives. For example, the trimming compositions can include an additional component that reacts with surface region of the resist pattern, rendering the surface region soluble in an organic solvent rinsing agent. This optional component preferably contains functional groups chosen from —OH, —NH, —SH, ketones, aldehydes, —SiX wherein X is a halogen, vinyl ethers and combinations thereof. Without wishing to be bound by any particular theory, it is believed that the component diffuses into the resist pattern and reacts with carboxylic acid groups of the pattern. This reaction results in a polarity change of the surface, rendering the surface soluble in the organic solvent. This component can be useful, for example, where the photoresist pattern is formed by negative tone development (NTD) wherein the pattern is composed of unexposed portions of the photoresist comprising acid-labile groups. Such component if used is typically present in an amount of from 0.1 to 10 wt % based on total solids of the trimming composition.

The trimming composition can further include a surfactant. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly (alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such surfactant and other optional additives if used are typically present in the composition in minor amounts such as from 0.01 to 10 wt % based on total solids of the trimming composition.

The trimming compositions are preferably free of cross-linking agents as such materials can result in a dimensional increase of the resist pattern.

The trimming compositions can be prepared following known procedures. For example, the compositions can be prepared by dissolving solid components of the composition in the solvent components. The desired total solids content of the compositions will depend on factors such as the desired final layer thickness. Preferably, the solids content of the trimming compositions is from 1 to 10 wt %, more preferably from 1 to 5 wt %, based on the total weight of the composition.

Photoresist Pattern Trimming Methods

Processes in accordance with the invention will now be described with reference to FIG. 1A-I, which illustrates an exemplary process flow for forming a photolithographic pattern using a photoresist pattern trimming technique in accordance with the invention. While the illustrated process flow is of a positive tone development process, the invention is also applicable to negative tone development (NTD) processes. Also, while the illustrated process flow describes an LLE double patterning process, it should be clear that the trimming method can be used in any lithographic process where trimming of the photoresist pattern would be beneficial, for example, in other double patterning processes such as litho-etch-litho-etch (LELE) or self-aligned double patterning (SADP), as an ion implantation mask, or simply for patterning of one or more underlying layers.

FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a first photoresist layer 106 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer 103 which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™40A and AR™124 antireflectant materials.

A first photoresist layer 106 formed from a chemically amplified photosensitive composition comprising a matrix polymer having acid labile groups is disposed on the substrate over the antireflective layer (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the first photoresist layer 106 is from about 500 to 3000 Å.

The layer 106 can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The first photoresist layer 106 is next exposed to activating radiation 108 through a photomask 110 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, sub-300 nm or sub-200 nm such as 193 nm or EUV wavelengths (e.g., 13.5 nm), with 193 nm and EUV being preferred. The exposure energy is typically from about 10 to 80 mJ/cm$^2$, dependent upon the exposure tool and the components of the photosensitive composition.

Following exposure of the first photoresist layer 106, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. A latent image defined by the boundary between polarity-switched and unswitched regions (corresponding to exposed and unexposed regions, respectively) is thereby formed.

The first photoresist layer 106 is next developed to remove exposed regions of the layer, leaving unexposed regions forming a first resist pattern 106' having a plurality of features as shown in FIG. 1B. The features are not limited and can include, for example, a plurality of lines and/or cylindrical posts which will allow for the formation of line and/or contact hole patterns in the underlying layers to be patterned. In the case of a negative tone development process, where unexposed regions of the photoresist layer are removed and exposed regions remain to form the first pattern, an organic solvent developer is employed. The organic developer can, for example, be a solvent chosen from ketones, esters, ethers, hydrocarbons, and mixtures thereof, with 2-heptanone and n-butyl acetate being typical.

It is typical that the first resist pattern, for example, the plurality of lines and/or posts have a duty ratio of 1:2 or more, 1:1.5 or more or 1:1 or more before trimming. In the case of lines and posts, duty ratio is defined as the ratio of linewidth or post diameter (L) to the space length (S) between adjacent lines or posts, respectively (i.e., L:S). A higher duty ratio refers to a higher density of lines or posts, while a lower duty ratio refers to a lower density of (i.e., more isolated) lines or posts. With reference to FIG. 1B, the duty ratio prior to trimming is $L_1:S_1$.

A layer 112 of a photoresist pattern trimming composition as described herein is formed over the first photoresist pattern 106' as shown in FIG. 1C. The trimming composition is typically applied to the substrate by spin-coating. The solids content of the coating solution can be adjusted to provide a desired film thickness based upon the specific coating equipment utilized, the viscosity of the solution, the speed of the coating tool and the amount of time allowed for spinning. A typical thickness for the pattern trimming layer 112 is from 200 to 1500 Å.

As shown in FIG. 1D, the substrate is next baked to remove solvent in the trimming layer, to allow for the free acid to diffuse into the surface of the underlying first resist pattern 106' and the polarity-changing reaction in the first resist pattern surface region 114. The bake can be conducted with a hotplate or oven 116, with a hotplate being typical. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical. While a single baking step is typical, multiple-step baking can be used and may be useful for resist profile adjustment.

The first photoresist pattern is next contacted with a rinsing agent, typically a developing solution, to remove the residual trimming composition layer 112 and the surface region 114 of the first photoresist pattern 106", with the resulting trimmed pattern being shown in FIG. 1E. The rinsing agent is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH). Alternatively, an organic solvent developer can be used, for example, a solvent chosen from ketones, esters, ethers, hydrocarbons, and mixtures thereof, such as 2-heptanone and n-butyl acetate. The rinsing agent can further be or comprise water. As can be seen, the duty ratio of the first resist pattern after trimming ($L_2:S_2$) is smaller prior to trimming. The post-trimming duty ration can be, for example, 1:2 or less, 1:3 or less or 1:4 or less. In the case of a double patterning process, a typical duty ratio is about 1:1 before trimming and about 1:3 after trimming.

The trimmed resist pattern can be used for patterning of underlying layers at this point, as an ion implantation mask, or another purpose. The following description pertains to an LLE double patterning process. In LLE processes, the first resist pattern is typically stabilized prior to formation of the second resist pattern. Various resist stabilization techniques have been proposed such as ion implantation, UV curing, thermal hardening, thermal curing and chemical curing. Techniques are described, for example, in US2008/0063985A1, US 2008/0199814A1 and US 2010/0330503A1.

A second photoresist composition is coated over the first resist pattern 106" and BARC layer 104 to form a second photoresist layer 118, as shown in FIG. 1E. The second photoresist composition can be the same as or different from the photoresist composition used in forming the first resist layer and can be applied and processed in the same manner including the materials and conditions described above with respect to the first photoresist layer. The second photoresist composition is preferably positive-acting. Generally, selection for this composition will depend on the particular application and geometries involved. In the illustrated method, both the first and second photosensitive compositions are positive acting.

The second photoresist layer 118 can next be softbaked. If exposure of this layer is to be conducted with an immersion lithography tool, an immersion topcoat layer (not shown) can be disposed over the second photoresist layer. If a topcoat layer is used, the second photoresist layer 118 can be softbaked after the topcoat layer composition has been applied.

With reference to FIG. 1(F), the second photoresist layer 118 is selectively exposed to activating radiation 108 through a second photomask 120 which has optically opaque regions corresponding to portions of the second photoresist layer to remain after development for a positive tone development method. The exposed second photoresist layer 114 is heat-treated in a post-exposure bake and developed, leaving behind second resist pattern 118' disposed between lines of the first resist pattern 106", as depicted in FIG. 1G.

Next, the BARC layer 104 is selectively etched using the first and second resist patterns 106", 118' simultaneously as an etch mask, exposing the underlying hardmask layer 103. The hardmask layer is next selectively etched, again using the first and second resist patterns simultaneously as an etch mask, resulting in patterned BARC and hardmask layers 104', 103', as shown in FIG. 1H. Suitable etching techniques and chemistries for etching the BARC layer and hardmask layer are known in the art and will depend, for example, on the particular materials of these layers. Dry-etching processes such as reactive ion etching are typical. The first and second resist patterns 106", 118' and patterned BARC layer 104' are next removed from the substrate using known techniques, for example, an oxygen plasma ashing. Using the hardmask pattern 103' as an etch mask, the one or more layers 102 are then selectively etched. Suitable etching techniques and chemistries for etching the underlying layers 102 are known in the art, with dry-etching processes such as reactive ion etching being typical. The patterned hardmask layer 103' can next be removed from the substrate surface using known techniques, for example, a dry-etching process such as reactive ion etching. The resulting double patterned structure is a pattern of etched features 102' as illustrated in FIG. H. In an alternative exemplary method, it may be desirable to pattern the layer 102 directly using the modified first photoresist pattern 106" and second pattern 118' without the use of a hardmask layer 103. Whether direct patterning with the resist patterns can be employed will depend on factors such as the materials involved, resist selectivity, resist pattern thickness and pattern dimensions.

The following non-limiting examples are illustrative of the invention.

EXAMPLES

Photoresist Formulation and Resist Patterning

Example 1

The following monomers M1-M4 were used to form polymers for the photoresist composition described below:

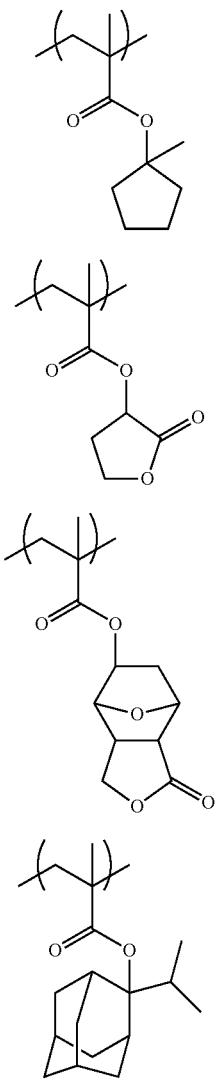

A positive chemically amplified photoresist composition was prepared by combining 1.28 g Polymer A (M1/M2/M3=4/4/2 mole ratio, Mw=10K), 1.28 g Polymer B (M1/M2/M3/M4=30/35/15/20, Mw=7K), 0.56 g of 4-(t-butylphenyl) tetramethylenesuflonium 4-(adamantane-1-carbonyloxy)-1,1,2,2-tetrafluorobutane sulfonate (TMS-Ad-TFBS), 0.078 g Trihydroxymethyl-carbamic acid tert-butyl ester, 0.003 g POLYFOX 656 surfactant, 33.56 g propylene glycol methyl ether acetate and 63.25 g methyl-2-hydroxy-iso-butyrate.

Resist A was spin-coated on an organic bottom antireflective coating (BARC AR™124 23 nm/AR26N, 77 nm, Dow Electronic Materials, Marlborough, Mass.) over 12 inch silicon wafers and softbaked at 95° C. for 60 sec. Then a 30 nm layer of OC™2000 topcoat (Dow Electronic Materials) was applied on the resist. The coated wafer was exposed on an ASML ArF 1900i immersion scanner with NA=1.30, Dipole 35Y illumination (0.9/0.635sigma), plus x polarization, using a mask having line and space patterns, and then post-exposure baked at 80° C. for 60 sec. The coated wafers were then treated with 0.26N (normal) aqueous tetramethylammonium hydroxide (TMAH) solution to develop a 45 nm 1:1 line and space pattern imaged resist layer (i.e., duty ratio=1:1).

Photoresist Trimming Compositions and Pattern Trimming

Example 2

PTC 1

2.388 g copolymer of t-butyl acrylate/methacrylic acid (7/3 of mole ratio), 0.062 g p-toluenesulfonic acid, 19.51 g decane and 78.04 g 2-methyl-1-butynol were mixed until all components dissolved and the mixture was filtered with a 0.2 micron Nylon filter, resulting in a photoresist trimming composition (PTC 1). A 60 nm film of PTC 1 was spin-coated on a photoresist-coated wafer of Example 1, baked at 70° C. for 60 s on a hotplate and developed in 2.38% TMAH developer for 12 s with a TEL Lithus GP nozzle.

Example 3

PTC 2

2.342 g copolymer of t-butyl acrylate/methacrylic acid (7/3 of mole ratio), 0.108 g p-toluenesulfonic acid, 19.51 g decane and 78.04 g 2-methyl-1-butynol were mixed until all components dissolved and the mixture was filtered with a 0.2 micron Nylon filter, resulting in a photoresist trimming composition PTC 2. A 60 nm film of PTC 2 was spin-coated on a photoresist-coated wafer of Example 1, baked at 70° C. for 60 s on a hotplate and developed in 2.38% TMAH developer for 12 s with a TEL Lithus GP nozzle.

Example 4

PTC 3

2.363 g copolymer of t-butyl acrylate/methacrylic acid (7/3 of mole ratio), 0.087 g 2,4-dinitrobenzenesulfonic acid, 19.51 g decane and 78.04 g 2-methyl-1-butynol were mixed until all components dissolved and the mixture was filtered with a 0.2 micron Nylon filter, resulting in a photoresist trimming composition PTC 3. A 60 nm film of PTC 3 was spin-coated on a photoresist-coated wafer of Example 1, baked at 70° C. for 60 s on a hotplate and developed in 2.38% TMAH developer for 12 s with a TEL Lithus GP nozzle.

Comparative Example 1

PTC 4

2.4 g copolymer t-butyl acrylate/methacrylic acid (7/3 of mole ratio), 0.1 g perfluorobutanesulfonic acid, 19.5 g decane and 78 g 2-methyl-1-butynol were mixed until all components dissolved and the mixture was filtered with a 0.2 micron Nylon filter, resulting in a photoresist trimming composition PTC 4. A 60 nm film of PTC 4 was spin-coated on a photoresist-coated wafer of Example 1, baked at 70° C. for 60 s on a hotplate and developed in 2.38% TMAH developer for 12 s with a TEL Lithus GP nozzle.

Comparative Example 2

PTC 5

2.374 g copolymer of t-butyl acrylate/methacrylic acid (7/3 of mole ratio), 0.076 g camphorsulfonic acid, 19.51 g decane and 78.04 g 2-methyl-1-butynol were mixed until all components dissolved and the mixture was filtered with a 0.2 micron Nylon filter, resulting in a photoresist trimming composition PTC 5. A 60 nm film of PTC 5 was spin-coated on a photoresist-coated wafer of Example 1, baked at 70° C. for 60 s on a hotplate and developed in 2.38% TMAH developer for 12 s with a TEL Lithus GP nozzle.

The results are shown below in Table 1.

TABLE 1

| Example | Acid/loading | Final CD (nm) | ΔCD (nm) |
|---|---|---|---|
| 1 (no trimming) | NA | 45.2 | NA |
| 2 (PTC 1) | PTSA (equimolar to PFBuS) | 31.4 | −13.8 |
| 3 (PTC 2) | PTSA (1.74x equimolar to PFBuS) | 25.1 | −20.1 |
| 4 (PTC 3) | 2,4DBSA (equimolar to PFBuS) | 28 | −17.2 |
| Comp. 1 (PTC4) | PFBuS | 25.2 | −20 |
| Comp. 2 (PTC 5) | CSA (equimolar to PFBuS) | 41.1 | −4.1 |

PTSA = p-toluenesulfonic acid; PFBuS = perfluorobutanesulfonic acid; 2,4DBSA = 2,4-dinitrobenzenesulfonic acid; CSA = camphorsulfonic acid As can be seen, all acids were loaded in equimolar amounts except for PTC 3 in Example 4, in which 2,4-dinitrobenzenesulfonic acid was loaded in excess to match the shrink of PTC 4 (control) in Comparative Example 1 containing perfluorobutanesulfonic acid superacid. As can be seen, resist pattern trimming compositions PTC 1 and PTC 3 containing p-toluenesulfonic acid and 2,4-dinitrobenzenesulfonic acid, respectively, at equimolar loading in Examples 2 and 4 in accordance with the invention resulted in significant pattern trimming, although less than the perfluorobutanesulfonic superacid of Comparative Example 1, and significantly greater than the camphorsulfonic acid of Comparative Example 2.

Matching of CD and CD change (ΔCD) in Example 3 and Comparative Example 1 was done to allow for more accurate comparison of linewidth roughness (LWR) and resist profile of the resulting patterns. The wafers for these examples were visually observed top-down by SEM. The same LWR (2.9 nm) and excellent resist profiles were observed for both examples.

Advantages of resist trimming methods of the invention such as those exemplified in Examples 2 and 3 over the use of a superacid such as in Comparative Example 1 include, for example, the lower price and lower volatility of the organic acids, which makes it easier to manipulate these material in a manufacturing environment.

What is claimed is:

1. A method of trimming a photoresist pattern, comprising:
   (a) providing a semiconductor substrate;
   (b) forming a photoresist pattern on the substrate, wherein the photoresist pattern is formed from a chemically amplified photoresist composition comprising: a matrix polymer comprising an acid labile group; a photoacid generator; and a solvent;
   (c) providing a photoresist trimming composition comprising a matrix polymer, an aromatic acid that is free of fluorine, and an organic solvent, wherein the aromatic acid is present in the photoresist trimming composition in an amount of from 0.01 to 20 wt % based on total solids of the photoresist trimming composition, and then applying the photoresist trimming composition to the substrate over the photoresist pattern to form a coated subsrate;
   (d) heating the coated substrate, thereby causing a change in polarity of the matrix polymer of the photoresist pattern in a surface region of the photoresist pattern; and
   (e) contacting the photoresist pattern with a rinsing agent to remove the surface region of the photoresist pattern, thereby forming a trimmed photoresist pattern.

2. The method of claim 1, wherein the aromatic acid comprises an acid of the general formula (I):

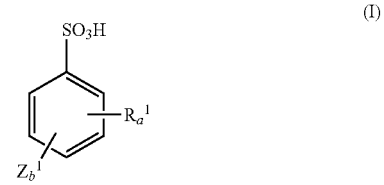

wherein: $R^1$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^1$ independently represents a group chosen from carboxyl, hydroxy, nitro, cyano, C1 to C5 alkoxy, formyl and sulfonic acid; a and b are independently an integer from 0 to 5; and a +b is 5 or less.

3. The method of claim 1, wherein the aromatic acid comprises an acid of the general formula (II):

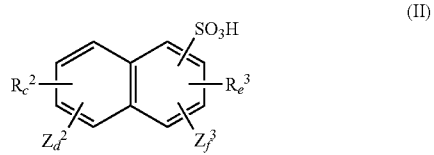

wherein: $R^2$ and $R^3$ each independently represents a substituted or unsubstituted C1-C20 alkyl group, a substituted or unsubstituted C5-C16 aryl group or a combination thereof, optionally containing one or more group chosen from carbonyl, carbonyloxy, sulfonamido, ether, thioether, a substituted or unsubstituted alkylene group, or a combination thereof; $Z^2$ and $Z^3$ each independently represents a group chosen from carboxyl, hydroxy, nitro, cyano, C1 to C5 alkoxy, formyl and sulfonic acid; c and d are independently an integer from 0 to 4; c +d is 4 or less; e and f are independently an integer from 0 to 3; and e +f is 3 or less.

4. The method of claim 1, wherein the aromatic acid comprises an acid of the general formula (III) or (IV):

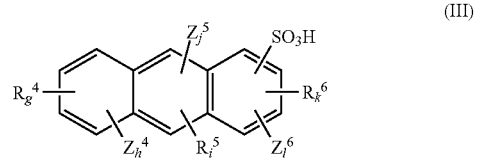

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g +h is 4 or less; i and j are independently an integer from 0 to 2; i +j is 2 or less; k and l are independently an integer from 0 to 3; and k +l is 3 or less;

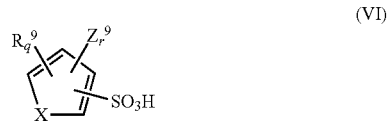

(IV)

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g +h is 4 or less; i and j are independently an integer from 0 to 1; i +j is 1 or less; k and l are independently an integer from 0 to 4; and k +l is 4 or less.

5. The method of claim 1, wherein the aromatic acid comprises an acid of the general formula (V):

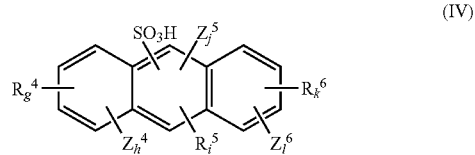

(V)

wherein: $R^7$ and $R^8$ each independently represents a substituted or unsubstituted C1-C20 alkyl group, a substituted or unsubstituted C5-C14 aryl group or a combination thereof, optionally containing one or more group chosen from carboxyl, carbonyl, carbonyloxy, sulfonamido, ether, thioether, a substituted or unsubstituted alkylene group, or a combination thereof; $Z^7$ and $Z^8$ each independently represents a group chosen from hydroxy, nitro, cyano, C1 to C5 alkoxy, formyl and sulfonic acid; m and n are independently an integer from 0 to 5; m +n is 5 or less; o and p are independently an integer from 0 to 4; and o +p is 4 or less.

6. The method of claim 1, wherein the aromatic acid comprises an acid of the general formula (VI):

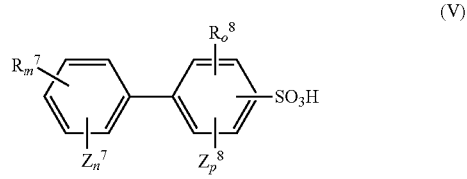

(VI)

wherein: X is O or S; $R^9$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^9$ independently represents a group chosen from carboxyl, hydroxy, nitro, cyano, C1 to C5 alkoxy, formyl and sulfonic acid; q and r are independently an integer from 0 to 3; and q +r is 3 or less.

7. The method of claim 1, wherein the rising agent comprises water or an aqueous alkaline solution.

8. The method of claim 1, wherein the rinsing agent comprises an organic solvent or solvent mixture.

9. The method of claim 1, wherein the aromatic acid is present in the photoresist trimming composition in an amount of from 0.01 to 20 wt % based on total solids of the photoresist trimming composition.

10. The method of claim 9, wherein the matrix polymer of the photoresist trimming composition is present in the photoresist trimming composition in an amount of from 80 to 99 wt % based on total solids of the photoresist trimming composition.

11. The method of claim 1, wherein the aromatic acid is a sulfonic acid.

12. The method of claim 11, wherein the aromatic acid is p-toluenesulfonic acid.

13. The method of claim 11, wherein the aromatic acid is 2,4-dinitrobenzenesulfonic acid.

14. The method of claim 1, wherein the photoresist trimming composition is applied to the substrate by spin-coating.

15. The method of claim 1, wherein a content of the solvent of the photoresist trimming composition is from 90 to 99 wt % based on the trimming composition.

16. The method of claim 1, wherein the matrix polymer of the photoresist trimming composition is present in the photoresist trimming composition in an amount of from 80 to 99 wt % based on total solids of the photoresist trimming composition.

* * * * *